(12) United States Patent
Matsuo et al.

(10) Patent No.: US 7,664,996 B2
(45) Date of Patent: Feb. 16, 2010

(54) DIAGNOSTIC OPERATIONS ASSOCIATED WITH WIRELESS MODEM

(75) Inventors: Kotaro Matsuo, Poway, CA (US); Won Sik Kim, San Diego, CA (US); Eugene Chekal, San Diego, CA (US); Haribalaji Kumar, Poway, CA (US)

(73) Assignee: Kyocera Corporation, Kyoto (JP)

( * ) Notice: Subject to any disclaimer, the term of this patent is extended or adjusted under 35 U.S.C. 154(b) by 386 days.

(21) Appl. No.: 11/625,203

(22) Filed: Jan. 19, 2007

(65) Prior Publication Data

US 2008/0176520 A1 Jul. 24, 2008

(51) Int. Cl.
G06F 11/00 (2006.01)
G06F 11/32 (2006.01)
(52) U.S. Cl. ............... 714/48; 714/44; 714/57
(58) Field of Classification Search ............ 714/48, 714/57, 44, 55
See application file for complete search history.

(56) References Cited

U.S. PATENT DOCUMENTS

| | | | |
|---|---|---|---|
| 6,762,930 B2 | 7/2004 | Minne | |
| 6,834,077 B1 * | 12/2004 | Woude | 375/222 |
| 6,915,343 B1 * | 7/2005 | Brewer et al. | 709/224 |
| 7,100,011 B2 * | 8/2006 | Winters et al. | 711/165 |
| 7,206,933 B2 * | 4/2007 | Strongin et al. | 713/168 |
| 7,281,171 B2 * | 10/2007 | Brown | 714/48 |
| 7,308,611 B2 * | 12/2007 | Booth | 714/40 |
| 2004/0164166 A1 * | 8/2004 | Mahany et al. | 235/472.02 |
| 2005/0066103 A1 | 3/2005 | Shinozaki | |
| 2005/0246722 A1 * | 11/2005 | Shier et al. | 719/321 |

FOREIGN PATENT DOCUMENTS

JP 07-326389 12/1995

OTHER PUBLICATIONS

Sunrise Glossary retrieved Mar. 20, 2009 http://www.sunrise-comp.co.uk/glossary.html.*
Wikipedia's Wireless Modem version from Oct. 15, 2006 http://en.wikipedia.org/w/index.php?title=Wireless_modem&oldid=81575707.*
Wikipedia's Device Driver version from Dec. 27, 2005 http://en.wikipedia.org/w/index.php?title=Device_driver&oldid=32815818.*
Linksys "WPC300N Data Sheet" (at www.linksys.com/servlet/Satellite? c=L_Product_C2&childpagename=US%2FLayout&cid=11447635131968&pagename=Linksys%2FCommon%2FVisitorWrapper).

* cited by examiner

*Primary Examiner*—Scott T Baderman
*Assistant Examiner*—Joseph Schell

(57) ABSTRACT

A visible diagnostic component for an electronic device having a form factor is described. The electronic component comprises a hardware interface component and a processor. The hardware interface component is configured to physically interface with a computer hardware interface associated with a computing device having an operating system. The processor is configured to perform a first operation that tests the communications with a device driver that is related to the electronic device. The first operation generates a first signal that indicates the result of the first operation. The second operation performed by the processor tests the communications between the wireless device and the operating system of the computing device. The second operation is configured to generate a second signal that indicates the result of the second operation.

20 Claims, 3 Drawing Sheets

DIAGNOSTIC OPERATIONS ASSOCIATED WITH WIRELESS MODEM

FIELD OF THE INVENTION

This invention relates to an electronic device having a diagnostic mechanism. More particularly, the invention relates to an electronic device with a self-diagnostic mechanism that communicates with a personal computer.

BACKGROUND

Carriers provide electronic devices such as wireless PC cards that interface with personal computers. The illustrative wireless PC card provides wireless network access. The download and upload speeds of the wireless PC cards depend on the capabilities of the network. Generally, these electronic devices such as wireless PC cards are inserted into a computing device having an interface that complies with a particular standard, e.g. the Person Computer Memory Card International Association (PCMCIA) standards. The computing device may be a notebook computer, a desktop computer, a personal digital assistant (PDA), or any other such device configured to receive the electronic device.

With respect to wireless PC cards, it is common for the PC cards to fail to establish a network connection; however, it's a challenge to determine the cause for the failure. The cause of the failure may be at the PC card, at the computing device, or in the wireless network.

When the subscriber or user calls technical support to resolve a failed network connection, the challenge is to diagnose and resolve the problem quickly. With personal computers (PCs) this problem is compounded by the fact that PCs commonly freeze up or become inoperative.

PCs become inoperative for various reasons that include the PC not complying with established standards, registry problems, too many programs running, PC resources not being optimized, application-specific problems, driver problems, patches, operating system problems, and other such issues.

For example, PC standards may require a voltage of 3.3V be supplied to the PCMCIA bus, but the actual voltage supplied by the PC may decrease depending upon how much current draw exists. As a result, for higher power PCMCIA devices, actual voltage supplied may be only 2.7V. Additionally, there may be problems with the registry system caused by loading and removing software programs. Furthermore, too many programs may be running in the background. Further still, the PC settings and resources may no longer be optimized, and result in some type of computer failure. Yet another problem with personal computers is that applications may not be fully compatible with a PCs operating system. For example, a particular application may acquire direct control of a particular port and not let another application access the desired port setting. Further still, another problem could be that the drivers have not been properly loaded, or patches that are intended to resolve problems with the applications or OS fail to work properly.

PC cards are electronic devices having a form factor. The term "form factor" is used to describe the size and format of PC motherboards, hard drives, power supplies, cases, and add-in cards such as PC cards. The term "form factor" also refers to the shape of a housing or mechanical connection associated with a device or mechanism within the context of its interface with other devices or mechanisms. Electronic devices having a form factor share the same problem as PC cards interfacing with a personal computer.

SUMMARY

A visible diagnostic component for an electronic device having a form factor is described. The electronic component comprises a hardware interface component and a processor. The hardware interface component is configured to physically interface with a computer hardware interface associated with a computing device having an operating system. The processor is configured to perform a first operation that tests the communications with a device driver that is related to the electronic device. The first operation generates a first signal that indicates the result of the first operation. The second operation performed by the processor tests the communications between the wireless device and the operating system of the computing device. The second operation is configured to generate a second signal that indicates the result of the second operation.

Additionally, a diagnostic component for an electronic device that is configured to be received by a computing device is described. The electronic device comprises a means for physically interfacing with a computer hardware interface associated with the computing device wherein the computing device has an operating system. The electronic device also comprises a means for generating a first signal adapted to indicate the result of a first operation that tests communications with a device driver that is related to the electronic device. Also, the electronic device comprises a means for generating a second signal adapted to indicate the result of a second operation that tests the communication between the electronic device and the operating system of the computing device. Further still, the electronic device comprises a means for presenting the first signal and the second signal on the electronic device.

Furthermore, a method for diagnosing an electronic device having a form factor that physically interfaces with a computer hardware interface associated with a computing device is described. The method comprises indicating the result of a first operation with a first signal, where the first operation tests communications with a device driver that is related to the electronic device. The method also comprises indicating the result of a second operation with a second signal where the second operations tests communications between the electronic device and the operating system of the computing device. The method then proceeds to generate diagnostic information with the first signal and said second signal.

DRAWINGS

The present invention will be more fully understood by reference to the following drawings which are for illustrative, not limiting, purposes.

DETAILED DESCRIPTION

Persons of ordinary skill in the art will realize that the following description is illustrative and not in any way limiting. Other embodiments of the claimed subject matter will readily suggest themselves to such skilled persons having the benefit of this disclosure. It shall be appreciated by those of ordinary skill in the art that the systems and apparatus described hereinafter may vary as to configuration and as to details. Additionally, the method may vary as to details, order of the actions, or other variations without departing from the illustrative method disclosed herein.

The device and methods described herein allow a variety of different problems between an electronic device and a personal computer (PC) to be easily diagnosed. More particularly, devices and methods described herein are related to installing an illustrative wireless PC card modem in a PC, and generating diagnostic information about the communications between the illustrative wireless PC card modem and the PC. This diagnostic information is generated before initiating wireless communications with the network. The diagnostic information can be used by the owner of the PC or this diagnostic information may be provided to technical support. The diagnostic information can then be used to resolve problems associated with communication between the illustrative wireless PC card modem and the PC.

Although the illustrative embodiment is a wireless PC card modem, the device and methods described above can be applied to electronic devices having a form factor and which interfaces with a personal computer, a PDA device, an Internet appliance, a thin client or other appliance device. Additionally, the device and methods described provide a diagnostic component that can be easily integrated with an electronic device having a form factor and hardware interface that interfaces with a personal computer.

Figure 1:
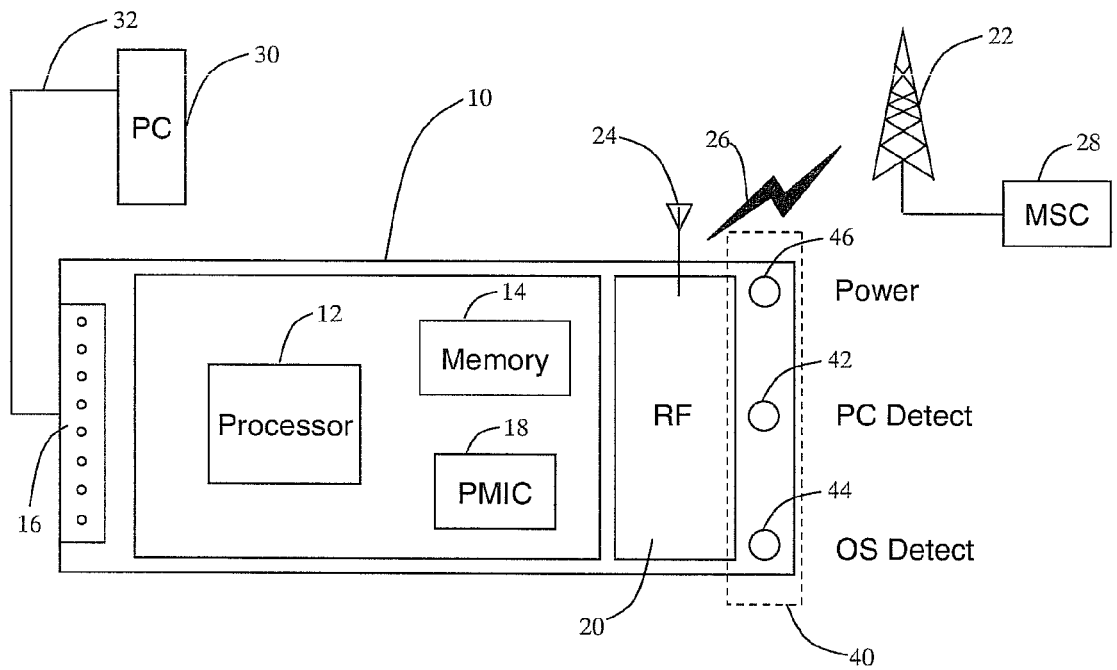
FIG. 1 shows a block diagram of an illustrative electronic device such as a wireless PC card modem with an integrated diagnostic mechanism.

Referring to FIG. 1, there is shown an illustrative electronic device with an integrated diagnostic mechanism. The illustrative electronic is a wireless PC card modem 10. The PC card 10 has the form factor of a peripheral interface for a laptop computer or notebook computer, and conforms to the Peripheral Component MicroChannel Interconnect Architecture (PCMCIA) standard, and is also referred to as a PCMCIA card. There are different PC Card standards such as a Type II PC card. It will be appreciated that the interface of PC card 10 may conform to a different interface configuration or standard in other embodiments The illustrative wireless PC card modem 10 comprises processor 12 coupled to memory 14 and to input/output hardware interface 16. A power source (not shown) supplies power to the wireless PC card modem 10. A Power Management Integrated Circuit (PMIC) 18 is also communicatively coupled to the processor 12 and regulates the use of power by the wireless PC card modem 10. Additionally, an RF component 20 is configured to wirelessly communicate with an illustrative base station 22.

The wireless PC card modem communicates wirelessly by transmitting and receiving electromagnetic energy in the radio frequency band via an antenna 24 coupled to the RF component 20. An RF communication link 26 is created with the base station 22 for exchanging voice and/or data communications. Although a single base station 22 is depicted, the wireless PC card modem 10 is capable of communication with one or more base stations, where each base station is generally responsible for managing cellular communications with defined geographic regions, such as cellular regions. The RF component may comprise a primary antenna and a receive diversity antenna design (not shown) for improved signal strength.

The illustrative base station 22 is further connected to a mobile switching center 28. By way of example and not of limitation, the mobile switching center 28 manages communications between the base station 22 and other voice and/or data networks (not shown) such as the Internet and the public switched telephone network (PSTN).

The processor 12 is configured to process computer executable code that provides a number of network services such as connecting services, firewall services, network address translation (NAT) services, proxy services, dynamic host configuration protocol (DHCP) services, and/or administration services. In operation, the processor assists in establishing a network connection such as a data connection with base station 22.

By way of example and not of limitation, in certain North American CDMA cellular network markets, a broadband data connection referred to as evolution data only (EVDO) may be established between the wireless PC card modem 10 and the base station 22. Other connection techniques such as dial-up Point-to-Point protocol (PPP) may also be used for establishing the connection between the PC card modem 10 and the base station 22. As part of negotiating an Internet data connection between the PC card modem 10 and base station 22, the PC card modem 10 is assigned a wide area network IP address. Other configuration parameters such as the default DNS server IP address and the gateway IP address are also typically defined during this process. Once the Internet connection between the PC card modem 10 and the base station is established, the PC card modem 10 is able to access resources on the Internet. The illustrative EVDO technology is a third generation (3G) technology, which supports both voice data and non-voice data. By way of example of not of limitation, other mobile technologies include W-CDMA, UMTS, 1xEV-DO, TD-SCDMA, EDGE, and WiMAX. These mobile technologies are wide area networks that cover a broad geographic area.

In another illustrative example, a second wireless connection may also be established using another wireless standard. For example, the RF link 26 may be a wireless link established using one more standards such as the IEEE 802.11 standard. Generally, the 802.11 networks are short range networks that are used for Internet access, while the wide area networks cover a much broader geographic area.

Although the wireless PC card modem 10 provides wireless network connectivity, various problems arise during the installation and use of wireless PC card modem 10. As described above, these problems occur before initiating wireless network communications and are associated with the communications between the wireless PC card modem 10 and PC 30. The diagnostic component described herein is integrated with the electronic device and provides diagnostic information related electrical and communications between the electric device, e.g. PC card modem 10, and the computing device, e.g. PC 30. The diagnostic information is provided before establishing a wireless network connection with a base stations or access points.

A physical interface between the electronic device and the computing device is required. In the illustrative embodiment, the hardware interface 16 supports having the wireless PC card modem 10 operatively coupled to the PC 30. An illustrative bus 32 permits data to be communicated between the illustrative PC 30 and the wireless PC card modem 10. Although the illustrative electronic device is a wireless PC card modem 10, any other electronic device having a means for physically interfacing with a computing device having an operating system (OS) can be used.

To assist in resolving PC related problems, a diagnostic component is integrated into the electronic device. In the illustrative embodiment, the diagnostic component 40 is integrated into the wireless PC card modem 10. The illustrative diagnostic component 40 comprises diagnostic elements 42, 44, 46 or any combination thereof having status indicators. In certain embodiments, diagnostic elements 42, 44 and 46 may be implanted by a single LED indicator having deferring illumination colors and/or illumination patterns. The status indicators can generate visual representations, audible representations, or any combination thereof.

The first diagnostic element 42 is a status indicator for a first operation, i.e. PC Detect, which tests communications with a device driver that is associated with the illustrative wireless PC card modem 10. A device driver, software driver, or "driver" is a software program that allows interaction between a hardware device and a computing device. The driver is a specialized hardware dependent computer program, which is also operating system specific and enables programs to interact transparently with the electronic device, e.g. wireless PC card modem 10. Depending on the specific computer architecture, drivers can be 8-bit, 16-bit, 32-bit, and more recently 64-bit, which corresponds to the architecture of the operating system for which the driver was developed. For example, most drivers for 32-bit Windows XP are, of course, 32-bit.

By way of example and not of limitations, drivers are used for interfacing with network cards, video adapters, printers, sound cards, local buses, different file systems, image scanners, digital cameras, and computer storage devices. Drivers are also used for I/O devices such as mice, keyboards and USB devices. Common levels of abstraction for device drivers are distinguished as either hardware or software. Generally, device drivers perform operations at a "low" software level that permits a computing device, e.g. personal computer, to communicate with the electronic device, e.g. PC card, with which there is a physical coupling.

The first "PC Detect" operation is performed by processor 12 and generates a first signal that indicates the result of the first operation, which test communications with a device driver. By way of example and not of limitation, the first diagnostic element 42 comprises a light source, e.g. LED, which visually indicates the resulting status of the first operation. Alternatively, the status indicator may be an audible sound, a combination of a visible representation and audible representation, or a means for presenting this first signal.

Although the illustrative embodiment teaches a processor 12 configured to generate the first signal that indicates the result of the first PC Detect operation, a means for generating the first signal that indicates the result of the first operation is only needed. Therefore, a controller, logic circuit, or any other similar means for generating the first signal may be used.

The second diagnostic element 44 is a status indicator for a second operation, i.e. OS Detect, which tests the communications between the electronic device and the operating system of the computing device. Additionally, the OS Detect operation may comprise determining whether the appropriate COM ports have been opened on both the PC card modem 10 and the personal computer, as described in further detail below. A means for presenting the second signal on the electronic device is also required. The means for presenting this second signal comprises a visible representation, an audible representation, or any combination thereof.

The second operation associated with the second diagnostic element 44 is performed by processor 12 and is configured to generate a second signal that indicates the result of the OS Detect operation. A means for presenting this second signal on the electronic device is required. The means for presenting this second signal includes a visible representation, an audible representation, or a combination thereof.

Although, the illustrative embodiment describes a processor configured to generate a second signal that indicates the status of the second OS Detect operation, a means for generating the second signal that indicates the status of the second operation is only needed. Therefore, a controller, logic controller, or any other means for generating the second signal that indicates the result of a second operation that tests the communications between the electronic device and the operating system of the computing device is needed.

Furthermore, an Application Detect operation may also be performed with a particular software application that is not associated with the illustrative wireless PC card modem 10. Thus, an Application Detect signal may be associated with communications between the illustrative electronic device and a software application running on the OS, which may be or may not be associated with the illustrative PC card modem 10.

The distinction between a software application program running on an OS and a device driver is significant. The device driver performs a relatively low level driver function, which is OS specific and supports hardware integration, but does not run on top of the operating system. The software application running on top of the OS performs a "high" level operation because, generally, the driver must be operating properly to enable the electronic device to communicate with the software application program.

A third diagnostic "Power" element 46 is associated with a third "Power" operation that detects whether the computing device is supplying the correct power to the electronic device, e.g. wireless PC card modem 10. The third operation generates a third signal that indicates the "Power" status. A means for presenting the third signal on the electronic device is shown in FIG. 1 and is referred to as the third diagnostic element 46. The means for presenting this third signal includes a visual representation, an audible representation, or a combination thereof.

The third operation determines if sufficient power is being supplied to the electronic device. The third operation may be performed by processor 12, a controller, a logic circuit, or any other means for performing the third operation or means for generating the third signal. If the proper power is not supplied, a third signal activates the status indicator. The third diagnostic element 46 is configured to indicate the result of the third operation.

Effective communications between the electronic device and the computing device requires that the correct type and amount of power be supplied to the electronic device from the PC 30. Without the correct power, the PC Detect test and OS Detect test will not be performed. Thus, ensuring that the correct amount of power is getting to the electronic device, e.g. wireless PC card modem 10, is critical to the proper installation of the electronic device.

In one illustrative embodiment the diagnostic elements 42, 44 and 46 provide a visual representation of the first signal, second signal, and third signal, respectively. Alternatively, an audible representation may be provided, or a combination of visual and audio representations may be provided The diagnostic information provided by diagnostic elements 42, 44, and 46 is provided before enabling wireless communications with a network. The diagnostic information identifies three concerns: whether sufficient power is getting to the electronic device; whether the PC driver is working; whether the electronic device can communicate with an application running on the PC's operating system.

Figure 2:
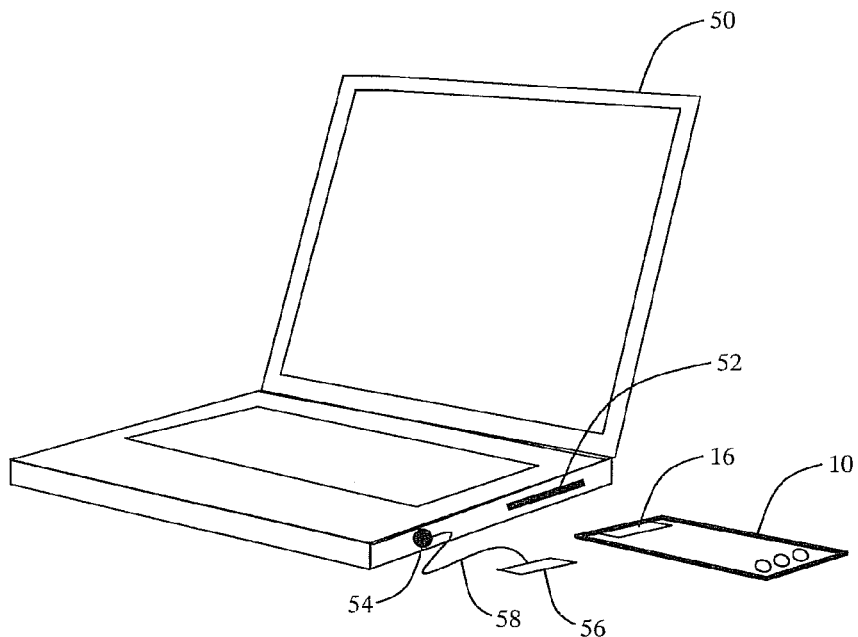
FIG. 2 shows an illustrative personal computer receiving the illustrative wireless PC card modem.

FIG. 2 shows an illustrative personal computer receiving the illustrative electronic device. The illustrative personal computer is a notebook computer 50. The wireless PC card modem 10 comprises an input/out hardware interface 16, which interfaces with PC card slot 52 on the notebook computer 50.

The illustrative wireless PC card modem 10 is slidably installed and/or removed from the PC card slot 52. The PC card modem 10 is not situated entirely within the notebook computer 50 so that diagnostic elements 42, 44 and 46 are visible to the user. The illustrative diagnostic elements are visible status indicators that help diagnose the notebook computer 50 when the computer "freezes up" or "hangs up" after the user attempts to enable wireless network communications. If the computer freezes up, it is difficult to diagnose whether the problem is: power getting to the PC card modem 10; drivers being properly installed on the notebook computer 50; unable to communicate with a software application running on the OS; or any combination thereof. By way of example and not of limitation, the status indicators are light emitting diodes (LEDs) having at least one color that can blink and/or remain a single solid color.

In an alternative embodiment, a Universal Serial Bus (USB) interface 54 having a PC card interface 56 is operatively coupled to the PC card hardware interface 16 and to a USB connection on the notebook computer 50. Thus, the PC card modem 16 is physical coupled to the notebook computer via the USB cable 58. A means for physically interfacing the electronic device with the computing device using computer hardware interface associated with the computing device can be shown by directly coupling the electronic device, e.g. PC card 10, to the computing device, e.g. notebook 50, or by indirectly coupling the electronic device, e.g. PC card, to the computing device, e.g. notebook, using one or more intermediary devices, e.g. USB cable 58.

System requirements for the personal computer 50 may include running Microsoft® Windows® 2000 or XP, a Standard Type II PC card slot on the PC and/or one or more USB connections. Software associated with the wireless PC card may have to be loaded onto the personal computer. The software may be embodied as computer instructions stored on a CD-ROM or other such media configured to store computer instructions. The illustrative personal computer 50 must have sufficient memory to run the software associated with the wireless PC card. The illustrative CD-ROM comprises device drivers and application software programs that run on the OS of the notebook computer 50.

By way of example and not of limitation, the illustrative wireless PC card 10 may be capable of data speeds of up to 2.4 Mbps on EV-DO services, with typical download speeds of 400-500 kbps. Additionally, the wireless PC card may provide CDMA2000 1X connections at 60-80 kbps, with bursts of up to 153 kbps.

Figure 3:
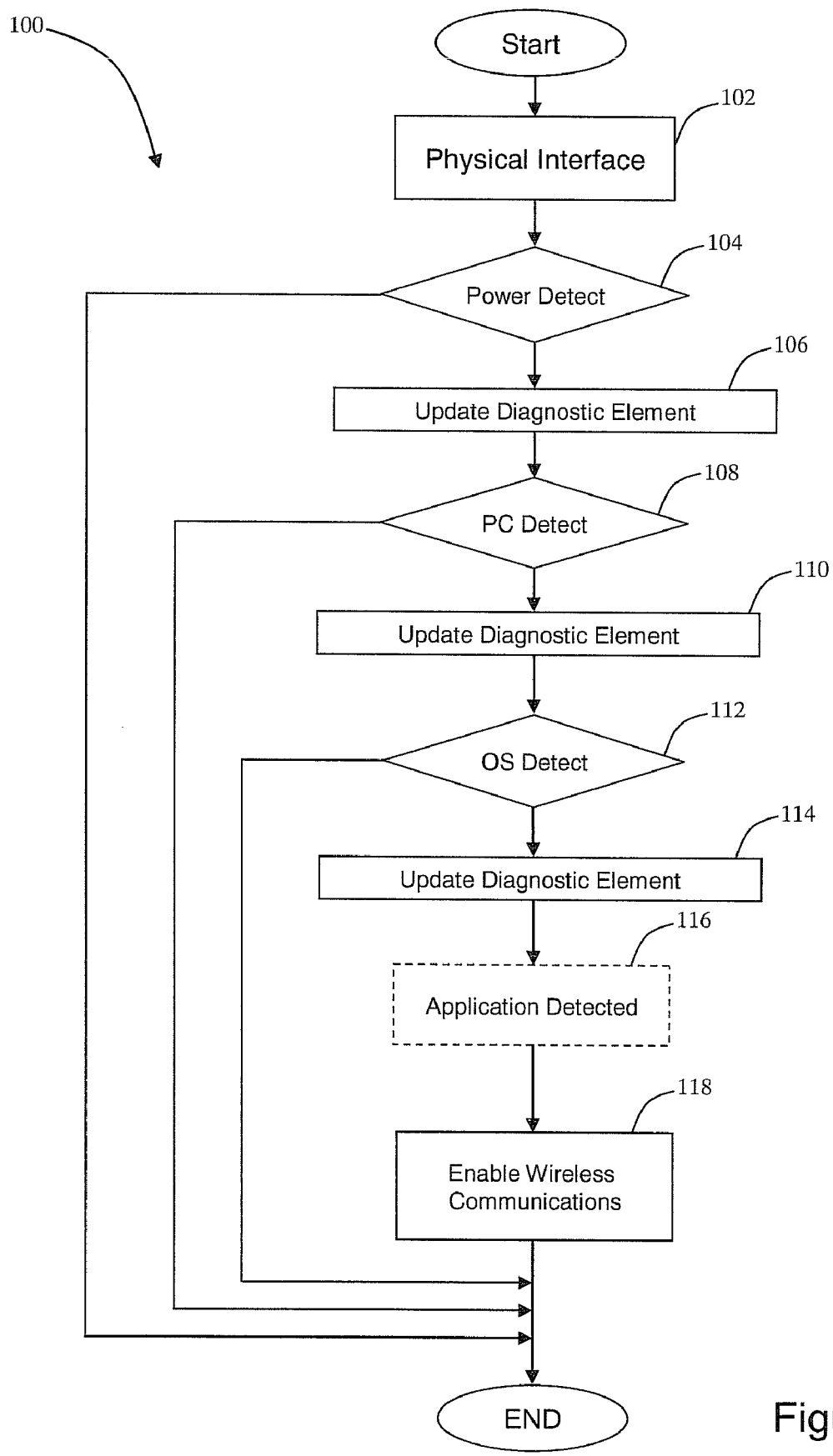
FIG. 3 shows an illustrative flowchart of the communications performed between the electronic device and the personal computer.

FIG. 3 shows an illustrative flowchart of the communications performed between the electronic device and the personal computer. The method is initiated at block 102 where a physical interface between the electronic device and the computing device is performed. Generally, any electronic device having a means for physically interfacing with the computing device can be used. In one illustrative embodiment, the wireless PC card modem is slidably installed into the PC card slot of the PC 30. In an alternative embodiment, a USB cable 58 having a PC card interface 56 is operatively coupled to the PC card hardware interface 16 and to a USB connection on the notebook computer 50.

The method then proceeds to decision diamond 104 where the power supplied to the electronic device is detected or tested. A "Power Detect" operation is performed that determines whether the computing device is supplying satisfactory power to the electronic device. The correct type and amount of power and/or voltage must be supplied to the electronic device from the computing device for the electronic device to operate properly. The Power Detect operation generates a Power Detect signal that indicates the "power" status.

In the illustrative USB bus embodiment, power is applied to PCMCIA bus of the PC card modem 10 from the PC 30 or notebook 50. The Power Management Integrated Circuit (PMIC) 18 boots a Mobile Station Module (MSM), which is associated with the processor 12. If signals are being generated by the MSM, and the method proceeds to block 106 where the diagnostic element 46 is updated to indicate that the PC card modem has obtained the necessary power. If the MSM is alive and the appropriate signals are being generated by the MSM, then the Power Detect signal is favorable and the method proceeds to decision diamond 108. However, if the MSM fails to operate properly then the user knows that it is at this point where the system has failed.

At decision diamond 108, the "PC Detect" operation is performed. The PC Detect operation tests communications with a device driver that is associated with the illustrative wireless PC card modem 12. The PC Detect operation generates a PC Detect signal that indicates the result of testing communications with the device driver. The PC Detect diagnostic element 42 receives the PC Detect signal and indicates the status associated with the PC Detect operation.

With respect to the illustrative notebook computer 50 embodiment, after the notebook's plug and play (PnP) feature on the Windows OS detects the PCMCIA insertion and identifies the USB bus, the USB driver on the illustrative PC card modem 10 becomes active. The USB driver then reports the Product ID (PID) and Vendor ID (VID) and the Windows OS identifies the PID and VID, and loads the USB driver associated with the illustrative wireless PC card modem 10.

In the illustrative embodiment, if communications between the wireless PC card modem 10 and the notebook computer 50 device driver succeed at decision diamond 108, the method proceeds to block 110 where the PC Detect signal updates the diagnostic element 42. However, if the device driver fails to communicate with one another, the diagnostic element 42 is not updated and the user knows that it is at this point where the system has failed.

At decision diamond 112, an OS Detect operation is performed that tests the communications between the electronic device and a first software application resident on the operating on the electronic device. In one embodiment, the OS Detect operation is associated with detecting if the appropriate COM ports have been opened. The OS Detect operation generates an OS Detect signal that is received by the diagnostic element 44, which indicates the status of the OS Detect operation.

In operation, the illustrative notebook 50 runs the PC card modem 10. The PC card modem 10 and notebook 50 open two COM ports, namely, a primary and secondary port. More particularly, the PC card modem 10 proceeds to open the primary Attention (AT) port and the secondary Debug Mode (DM) port. Meanwhile the notebook's primary port may now be used for AT commands and data communications, and the secondary port may perform reading and writing operations for the wireless PC card modem 10.

Thus, if at decision diamond 112 the OS Detect operation indicates that the communications between the electronic device and an application running on the computing device succeeds, the method proceeds to block 114 where OS Detect signals update the diagnostic element 42. However, if the OS Detect operation indicates that communications fail, the diagnostic element 44 is not updated and the user knows that it is at this point that the system failed.

At block 116 the connectivity Application may be detected, if this feature is available. The Applications is a software application running on the OS of the notebook 50. The Application is not necessary for the basic functionality of the wireless PC card modem. For example in Windows XP, a Dial Up Network (DUN) connection can be established without using an additional application. However, the application may enable additional features for the end user, which are not available through a modem protocol. These may include features such as signal strength display, battery level notification, or network type indication.

If the software application running on the OS of the illustrative notebook 50 is active, then the notebook 50 sends an instruction to the PC card modem 10 to switch to a proprietary protocol such as the Simple Modem Application and Reliable Transfer Protocol (SMART). After receiving this instruction, the PC card modem 10 proceeds to initialize the SMART subsystem resident on the PC card modem 10, and send an acknowledgement DM command. A SMART handshake follows between the PC card modem 10 and the notebook 50, and SMART commands are exchanged.

At block 118, wireless communications are enabled. As described above, the illustrative wireless PC card modem supports wireless communications across a wide area network or a local network. The multiple networking services performed by wireless PC card modem 10 are described above in further detail.

Figure 4A:
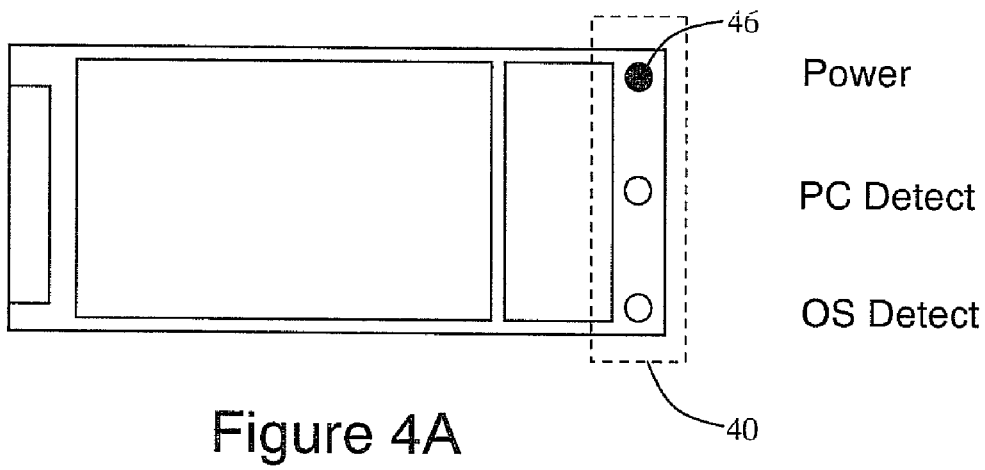
FIG. 4A through 4C shows a block diagram the illustrative electronic device after receiving diagnostic information.
Figure 4B:
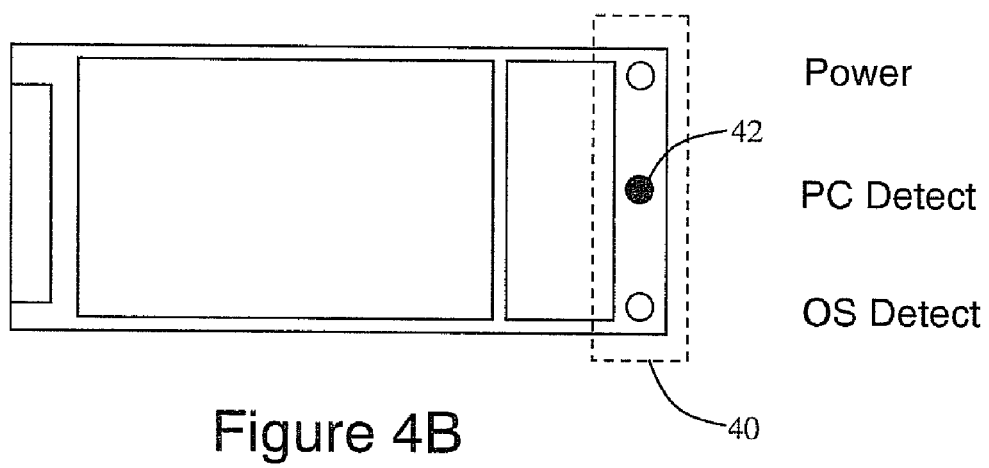
Figure 4C:
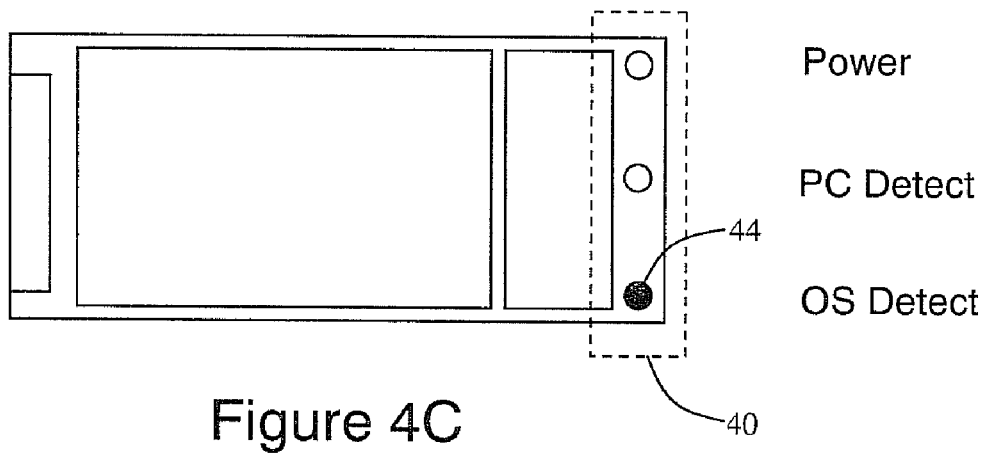

FIGS. 4A, 4B and 4C shows the illustrative electronic device after receiving diagnostic information. The diagnostic component 40 is associated with the wireless PC card 10. There are at least three states that are communicated to the diagnostic component 40. For the illustrative PC card 10, the illustrative diagnostic component 40 is visible to the user, and the remaining elements of the PC card may be housed within the computing device.

FIG. 4A shows an enabled Power Detect light 46 associated with the Power Detect operation. Additionally, FIG. 4B shows an activated PC Detect light 42 that is related to the PC Detect operation described above. Furthermore, FIG. 4C depicts the activated OS Detect light 44 associated with the OS Detect operation described throughout this Specification. Each of the activated lights associated may be a LED light that blinks and/or has one or more colors. Those skilled in the art shall appreciate that all three illustrative lights may be combined into at least one LED light having different colors, different blinking intervals, different sounds, different volumes, or any combination thereof.

The apparatus and methods described allow a variety of different problems associated with communications between an electronic device and a personal computer to be easily diagnosed. More particularly, problems associated with installing a wireless PC card in a personal computer can be quickly diagnosed before initiating wireless communications with the network. The diagnostic information can then be provided to technical support so that problems associated with communication between the wireless PC card and the PC can be resolved.

Although the illustrative embodiment is a wireless PC card, it shall be appreciated by those of ordinary skill in the art having the benefit of this disclosure, that the apparatus and methods described above can be applied to electronic devices having a form factor. Since electronic devices having a form factor share the same problem that wireless PC cards have interfacing with a personal computer, the apparatus and methods described provide a diagnostic component that can be easily integrated with an electronic device. Additionally, the diagnostic component can be easily interpreted.

Thus, it is to be understood that the foregoing is a detailed description of illustrative embodiments, and the scope of the claims is not limited to these specific embodiments or examples. Therefore, various elements, details, execution of any methods, and uses can differ from those just described, or be expanded on or implemented using technologies not yet commercially viable, and yet still be within the inventive concepts of the present disclosure. The scope of the invention is determined by the following claims and their legal equivalents.

The invention claimed is:

1. A plurality of diagnostic operations associated with a wireless modem, wherein the wireless modem comprises:
    a hardware interface component configured to physically interface with a computer hardware interface associated with a computing device, said computing device having an operating system and a device driver configured to communicate with the wireless modem;
    a processor configured to perform the plurality of diagnostic operations,
        a first diagnostic operation that tests communications with the device driver that is related to the wireless modem communicating with the computing device, the first diagnostic operation configured to generate a first diagnostic signal to indicate the result of the first diagnostic operation,
        a second diagnostic operation performed by the processor that tests the communications between the wireless modem and the operating system of the computing device, the second operation configured to generate a second diagnostic signal to indicate the result of the second diagnostic operation; and
    an RF component configured to communicate wirelessly with a base station, wherein if one of the first diagnostic signal and the second diagnostic signal indicates failed communications between the wireless modem and the computing device, then the RF component is unable to communicate wirelessly with the base station.

2. The wireless modem of claim 1, wherein the RF component is configured to communicate with a wide area network.

3. The wireless modem of claim 1 wherein the first diagnostic signal and the second diagnostic signal each provide diagnostic information associated with the wireless modem communicating with the computing device before enabling wireless communications.

4. The wireless modem of claim 3 wherein the wireless modem is a wireless PC card modem.

5. The wireless modem of claim 1 wherein the processor is configured to perform a third diagnostic operation that detects the computing device supplying power to the wireless modem, the third diagnostic operation configured to generate a third diagnostic signal adapted to indicate the result of the third diagnostic operation.

6. The wireless modem of claim 1 further comprising at least one light source that provides a visual representation of the first diagnostic signal and the second diagnostic signal.

7. The wireless modem of claim 6 further comprising at least one audible sound source that provides an audible representation of the first diagnostic signal and the second diagnostic signal.

8. A plurality of diagnostic operations associated with a wireless modem that is configured to be received by a computing device, the wireless modem comprises:
    a means for physically interfacing with a computer hardware interface associated with the computing device, said computing device having an operating system and a device driver configured to communicate with the wireless modem;

a means for generating a first diagnostic signal that indicates the result of a first diagnostic operation that tests communications with the device driver that is related to the wireless modem communicating with the device driver;

a means for generating a second diagnostic signal that indicates the result of a second diagnostic operation that tests the communications between the wireless modem and the operating system of the computing device;

a means for presenting the first diagnostic signal on the wireless modem a means for presenting the second diagnostic signal on the wireless modem; and an RF component configured to communicate wirelessly with a base station, wherein if one of the first diagnostic signal and the second diagnostic signal indicates failed communications between the wireless modem and the computing device, then the RF component is unable to communicate wirelessly with the base station.

9. The wireless modem of claim 8, wherein the RF component is configured to communicate with a wide area network.

10. The wireless modem electronic device of claim 8 wherein the first diagnostic signal and the second diagnostic signal each provide diagnostic information associated with the wireless modem communicating with the computing device before enabling wireless communications with the network.

11. The wireless modem of claim 10 wherein the RF component is configured to communicate with a wide area network.

12. The wireless modem of claim 11 further comprising a means for generating a third diagnostic signal that detects the computing device supplying power to the wireless modem.

13. The wireless modem of claim 11 wherein said means for presenting the first diagnostic signal comprises a first light source and the means for presenting the second diagnostic signal comprises a second light source.

14. The wireless modem of claim 11 wherein said means for presenting the first diagnostic signal and the means for presenting the second diagnostic signal comprises at least an audible sound source.

15. A method for diagnosing a wireless modem that physically interfaces with a computer hardware interface associated with a computing device having an operating system and a device driver configured to communicate with the wireless modem, said method for diagnosing the wireless modem comprising:

indicating the result of a first diagnostic operation performed by the wireless modem with a first diagnostic signal wherein the first diagnostic operation tests communications with a device driver that is related to the wireless modem communicating with the computing device;

indicating the result of a second diagnostic operation performed by the wireless modem with a second diagnostic signal wherein the second diagnostic operation tests communications between the wireless modem and the operating system of the computing device; and enabling an RF component associated with the wireless modem to communicate with a base station when the first diagnostic signal indicates that the wireless modem communications with the device driver are successful and when the second diagnostic signal indicates that the wireless modem communications with the operating system of the computing device are successful.

16. The method of claim 15 wherein the RF component is configured to communicate with a wide area network.

17. The method of claim 16 further comprising generating diagnostic information with the first diagnostic signal and the second diagnostic signal wherein the diagnostic information is generated before enabling wireless communications.

18. The method of claim 17 further comprising presenting the first diagnostic signal with a first light source and the second diagnostic signal with a second light source.

19. The method of claim 17 further comprising presenting the first diagnostic signal and the second diagnostic signal using at least one audible sound source.

20. The method of claim 17 further comprising indicating the result of a third diagnostic operation that detects the computing device supplying power to the wireless modem with a third diagnostic signal.

* * * * *